United States Patent [19]
Burra et al.

[11] Patent Number: 5,764,103
[45] Date of Patent: Jun. 9, 1998

[54] SWITCHING AMPLIFIERS INTO AND OUT OF CIRCUITS WITH REDUCED OUTPUT NOISE

[75] Inventors: Gangadhar Burra, Acton; Paul F. Ferguson, Jr., Dracut, both of Mass.

[73] Assignee: Analog Devices, Inc., Norwood, Mass.

[21] Appl. No.: 682,129

[22] Filed: Jul. 17, 1996

[51] Int. Cl.$^6$ ........................................... H03F 1/30
[52] U.S. Cl. ................................. 330/51; 330/9
[58] Field of Search .................... 330/9, 51, 149

[56] References Cited

U.S. PATENT DOCUMENTS

| | | | |
|---|---|---|---|
| 5,087,914 | 2/1992 | Sooch et al. | 341/120 |
| 5,381,148 | 1/1995 | Mueck et al. | 341/139 |
| 5,397,944 | 3/1995 | DuPuis | 327/307 |
| 5,585,756 | 12/1996 | Wang | 330/9 X |

OTHER PUBLICATIONS

Yu and Geiger, An Automatic Compensation Scheme with Ping–Pong Control of CMOS Operational Amplifiers, May, 1994 Jrnl. of Solid State Circuits, vol. 29, pp. 601–610.

Primary Examiner—James B. Mullins
Attorney, Agent, or Firm—Wolf, Greenfield & Sacks, P.C.

[57] ABSTRACT

An insubstantial amount of noise results at the output of a circuit when an output of a primary amplifier is disconnected from and reconnected to the circuit in which is operating. The primary amplifier is placed temporarily in a muting configuration. A secondary amplifier permanently in a muting configuration is connected in parallel with the primary amplifier. The output of the primary amplifier then is disconnected from a circuit node to which it is attached. The primary amplifier may then be taken out of its muting configuration. After, for example, configuring the primary amplifier as a comparator and calibrating its dc-offset voltage, the primary amplifier is placed back into a muting configuration. The secondary amplifier then is disconnected from the primary amplifier. The primary amplifier may subsequently be taken out of muting configuration to resume its normal function in the circuit.

25 Claims, 8 Drawing Sheets

5,764,103

SWITCHING AMPLIFIERS INTO AND OUT OF CIRCUITS WITH REDUCED OUTPUT NOISE

FIELD OF THE INVENTION

The present invention relates generally to electronic amplifiers and, more particularly, to methods and circuitry for reducing voltage spikes that are created at an output of an amplifier circuit when an output of an amplifier in the circuit is decoupled from and/or coupled to the circuit. This decoupling/coupling is performed, for example, to calibrate the amplifier to compensate for the dc-offset thereof.

BACKGROUND OF THE INVENTION

Many circuits that include an operational amplifier (op-amp) need to be calibrated to compensate for the inherent dc-offset voltage of the op-amp. If an op-amp in an amplifier circuit is not accurately calibrated, a discrete change in the gain setting of the amplifier circuit may result in an unwanted voltage step appearing at the output of the circuit. In certain applications, this voltage step may be undesirably large. For example, in audio reproduction applications, if an op-amp circuit's gain (−N) changes from a high-gain value to a low gain value, an audible "click" or "pop" may result at the output speaker (or other audio reproduction device) of the circuit.

Frequently, modern audio producing devices have a muting function, e.g., mute buttons on remote controls of televisions and stereos. These mute buttons typically change the gain (−N) of an op-amp circuit from a high gain value to gain value of approximately zero, i.e., a mute setting. Therefore, an audio reproduction circuit that utilizes a mute setting particularly needs to have its op-amps calibrated in order to ameliorate the adverse effects of the dc-offset voltages of the op-amps in the circuit.

There are several known techniques by which to calibrate the dc-offset voltages of op-amps. Several of these techniques require that the op-amps (which are desired to be calibrated) be decoupled from and reconnected to the amplifier circuits in which they are operating so that they may undergo dc-offset voltage calibration. When using such known techniques, however, unwanted voltage spikes may appear at the outputs of the amplifier circuits during their calibration cycles. Therefore, when such a circuit is used in an audio reproduction system, additional audible "clicks" and "pops" often are heard emanating from the speakers (or other audio reproduction devices) of the system when the circuit is calibrated to compensate for its dc-offset voltage.

It therefore is a general object of the present invention to provide a circuit that allows an op-amp to be decoupled from and/or coupled to an amplifier circuit while producing reduced voltage fluctuations at the output of the circuit.

SUMMARY OF THE INVENTION

According to a first aspect of the present invention, a circuit and method are disclosed for reducing voltage fluctuations at an output of an amplifier circuit when one stage of a multi-stage amplifier is decoupled from and/or coupled to the amplifier circuit. A circuit according to the first aspect includes: (a) a main amplifier including a first stage coupled to a second stage via a switch, (b) a catching amplifier connected in a muting configuration, and (c) a catching switch to couple a circuit node of the catching amplifier to the input of the second stage of the main amplifier. A circuit according to the first aspect also may include a muting mechanism coupled to the main amplifier to place the main amplifier in a muting configuration.

A method for disconnecting the amplifier stage from the amplifier circuit according to the first aspect of the invention includes the steps of: (a) connecting the main amplifier in a muting configuration, (b) coupling the circuit node of the catching amplifier to a circuit node between the stages of the main amplifier, and (c) uncoupling the output of the first stage of the main amplifier from the circuit node between the stages of the main amplifier. This method also may include the step of taking the main amplifier out of its muting configuration, so that it may, for example, undergo dc-offset calibration.

A method for connecting the amplifier stage into the amplifier circuit according the first aspect of the invention includes the steps of: (a) connecting the main amplifier in a muting configuration, (b) coupling the output of the amplifier stage to the circuit node between the stages of the main amplifier, and (c) uncoupling the circuit node of a catching amplifier from the circuit node between the stages of the main amplifier. This method also may include the step of taking the main amplifier out of its muting configuration so that it might resume normal operation.

According to a second aspect of the invention, a circuit and method are disclosed for reducing the voltage fluctuations at an output of an amplifier circuit when an amplifier is decoupled from and/or coupled to an output node of the amplifier circuit. A circuit according to the second aspect includes: (a) a main amplifier, (b) a catching amplifier connected in muting configuration, (c) a catching switch that couples an output of the catching amplifier to the output node during a first time interval, and (d) a switch to uncouple an output of the main amplifier from the output node of the circuit during a second time interval. This circuit also may include a muting mechanism to place the main amplifier in a muting configuration during a third time interval.

A method for disconnecting the output of the amplifier from the output node of the amplifier circuit according to the second aspect of the invention includes the steps of: (a) connecting the main amplifier in a muting configuration, (b) coupling an output of the catching amplifier to the output node of the circuit, and (c) uncoupling the output of the main amplifier from the Output node of the circuit.

A method for connecting the output of the amplifier to the output node of the amplifier circuit according to the second aspect of the invention includes the steps of: (a) connecting the main amplifier in a muting configuration, (b) coupling the output of the main amplifier to the output node of the circuit, and (c) uncoupling the output of the catching amplifier from the output node of the circuit.

According to both aspects of the invention, a catching amplifier is used to hold the output of an amplifier circuit in a "muted" state while an amplifier in the circuit is decoupled from and/or coupled to the amplifier circuit. By holding the output in Such a muted state, voltage fluctuations caused by the disconnecting/connecting of the main amplifier are significantly reduced.

DETAILED DESCRIPTION OF THE INVENTION

Figure 1:
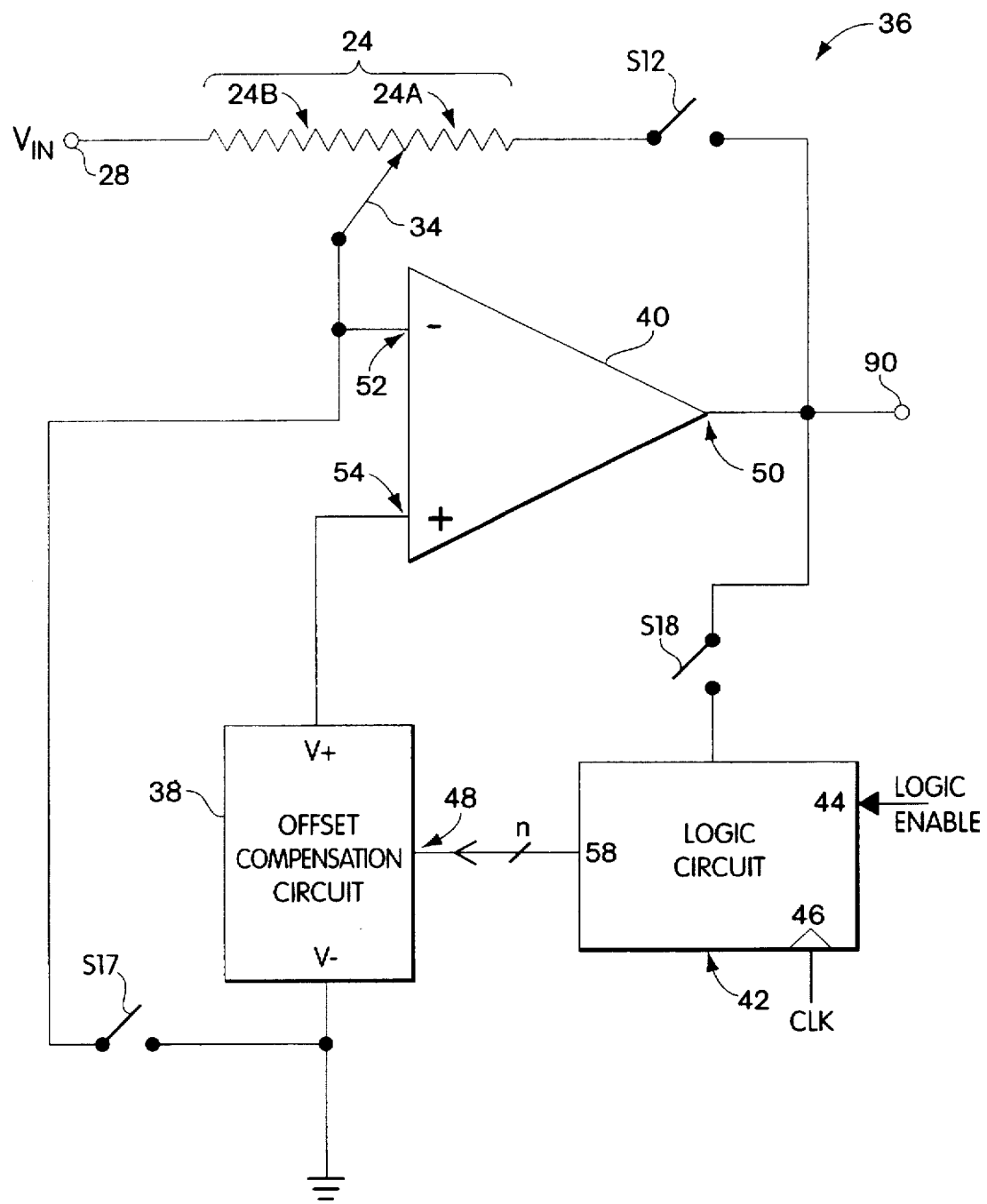
FIG. 1 is a partial schematic/partial block diagram of an offset calibration circuit which may be used with the invention.

FIG. 1 is a block diagram of an offset calibration circuit 36 according to one aspect of the invention. Referring to FIG. 1, when switch S12 is closed and switches S17 and S18 are open, circuit 36 is configured in a gain or attenuation configuration. That is, an input signal $V_{IN}$ presented at node 28 will be output at node 90 after being amplified or attenuated by amplifier circuit 36 (by a factor determined by the ratio of the resistances of resistor portions 24A and 24B of potentiometer 24, which ratio is selected by adjusting the position of wiper 34). Conversely, when switch S12 is open, and switches S17 and S18 are closed, amplifier 40 in circuit 36 is configured as a comparator and, as such, may be calibrated according to one aspect of the present invention. While this configuration of switches is suitable for switching circuit 36 between a gain/attenuation and a comparator configuration, it should be readily apparent to those skilled in the art that any similar switch arrangement could accomplish the desired result (i.e., temporarily configuring amplifier 40 as a comparator). Circuit 36 normally operates in its gain or attenuation configuration and is configured as a comparator only during a particular time interval (i.e., a calibration cycle). It is during this calibration cycle that the dc-offset voltage of amplifier 40 is calibrated.

Such a calibration cycle may be initiated upon power-up of a device including circuit 36 or may be initiated responsive to a user command. During an offset calibration cycle, a voltage is placed across inverting and non-inverting inputs 52 and 54, respectively, of amplifier 40 via outputs V− and V+, respectively, of offset compensation circuit 38. Output 50 of amplifier 40 (which is operating as a comparator) provides a high or low logic signal to input 56 of logic circuit 42, depending on whether amplifier 40 senses a greater voltage at input 52 or at input 54. The voltage that is sensed by amplifier 40 at inputs 52 and 54, and that thus determines the voltage at output 50 of amplifier 40, includes: (1) the voltage across outputs V+ and V− of offset compensation circuit 38, and (2) the inherent dc-offset voltage of amplifier 40. Logic circuit 42 provides an n-bit digital output signal (representing an offset compensation voltage) at output 58 that is received by offset compensation circuit 38 at input 48. During a calibration cycle, the digital output signal at output 58, in response to a clock signal (CLK) at input 46 and depending of the logic level of input 56, is increased or decreased. This increase or decrease in the digital input signal at input 48 of offset compensation circuit 38 causes a corresponding increase or decrease in the offset compensation voltage across outputs V+ and V− of offset compensation circuit 38.

In one embodiment of the circuit shown in FIG. 1, offset compensation circuit 38 and logic circuit 42 can be implemented with a DAC and an up/down counter, respectively. Any circuitry, however, which performs a substantially equivalent function to that performed by these devices may alternatively be used without departing from the scope of the invention. The digital "count" output of up/down counter 42 at output 58 controls the voltage level across outputs V+ and V− of DAC 38. When a signal LOGIC ENABLE 122 (at counter enable input 44 of up/down counter 42) is asserted, e.g., is in a logic high state, up/down counter 42, responsive to a clock signal (CLK) at input 46, will cause up/down counter 42 to increment or decrement its count at output 58. Whether up/down counter 42 increments or decrements its count depends on the state (i.e., logic high or logic low) of the signal received by up/down selection input 56 of up/down counter 42 from amplifier 40. Thus, if the input voltage at up/down selection input 56 is in a first state (e.g., logic high), up/down counter 42 will increment its output count by one every clock cycle so long as up/down counter 42 is enabled, and if the input voltage at up/down selection input 56 is in a second state (e.g., logic low) up/down counter 42 will decrement its output count by one every clock cycle so long as up/down counter 42 is enabled.

During a calibration cycle, i.e., when amplifier 40 is configured as a comparator and up/down counter 42 is enabled, the voltage across outputs V+ and V− of DAC 38 will increase or decrease every clock cycle corresponding to changes in the digital signal, i.e., the count, at input 48. For example, if the voltage across outputs V+ and V− of DAC 38 is less than the inherent dc-offset voltage of amplifier 40, output 50 of amplifier 40 will provide a logic high voltage. up/down counter 42 will increment its count by one, and the voltage across outputs V+ and V− of DAC 38 will increase by a discrete voltage level corresponding to the change in the digital count at input 48. In this manner, the voltage across outputs V+ and V− of DAC 38 will increase or decrease every clock cycle until this voltage approximates the inherent dc-offset voltage of amplifier 40.

When the inherent dc-offset voltage of amplifier 40 is reached, the output of amplifier 40 will switch states. This switching of states will cause up/down counter 42 to reverse the direction of its count, causing the voltage across outputs V+ and V− to change accordingly, and thus causing the output of amplifier 40 to switch states once again. Therefore, once the dc-offset voltage of amplifier 40 is approximated by the voltage across outputs V+ and V−, the output of amplifier 40 will switch states every clock cycle until the signal LOGIC ENABLE 122 at input 44 of up/down counter 42 is deserted, e.g., placed in a logic low state. After the signal LOGIC ENABLE 122 is deserted, the final output Count of up/down counter 42 is maintained at output 58, and is used as a permanent input to DAC 38. At the end of the calibration cycle, switch S12 is closed and switches S17 and S18 are opened to reconfigure circuit 36 in a gain or attenuation configuration. Due to the dc-offset calibration cycle, however, the voltage between outputs V+ and V− of DAC 38 now is applied, respectively, between non-inverting input 54 of amplifier 40 and a reference node, e.g., ground node GND, thereby compensating for the inherent dc-offset voltage of amplifier 40.

For this calibration circuit to function properly, the maximum positive and negative offset compensation voltages which can be produced by DAC 38 (based on the output of up/down counter 42) should be larger than the expected inherent dc-offset voltage of amplifier 40. Also, the calibration cycle should be long enough with respect to a clock (CLK) period such that a sufficient number of clock cycles occur during the calibration period to ensure that up/down counter 42 will reach its maximum or minimum count, if required, during a single calibration period. Additionally, if possible, up/down counter 42 should be configured such that once its minimum or maximum count is reached, it maintains that count rather than wrapping to the maximum or minimum count, respectively.

Figure 2:
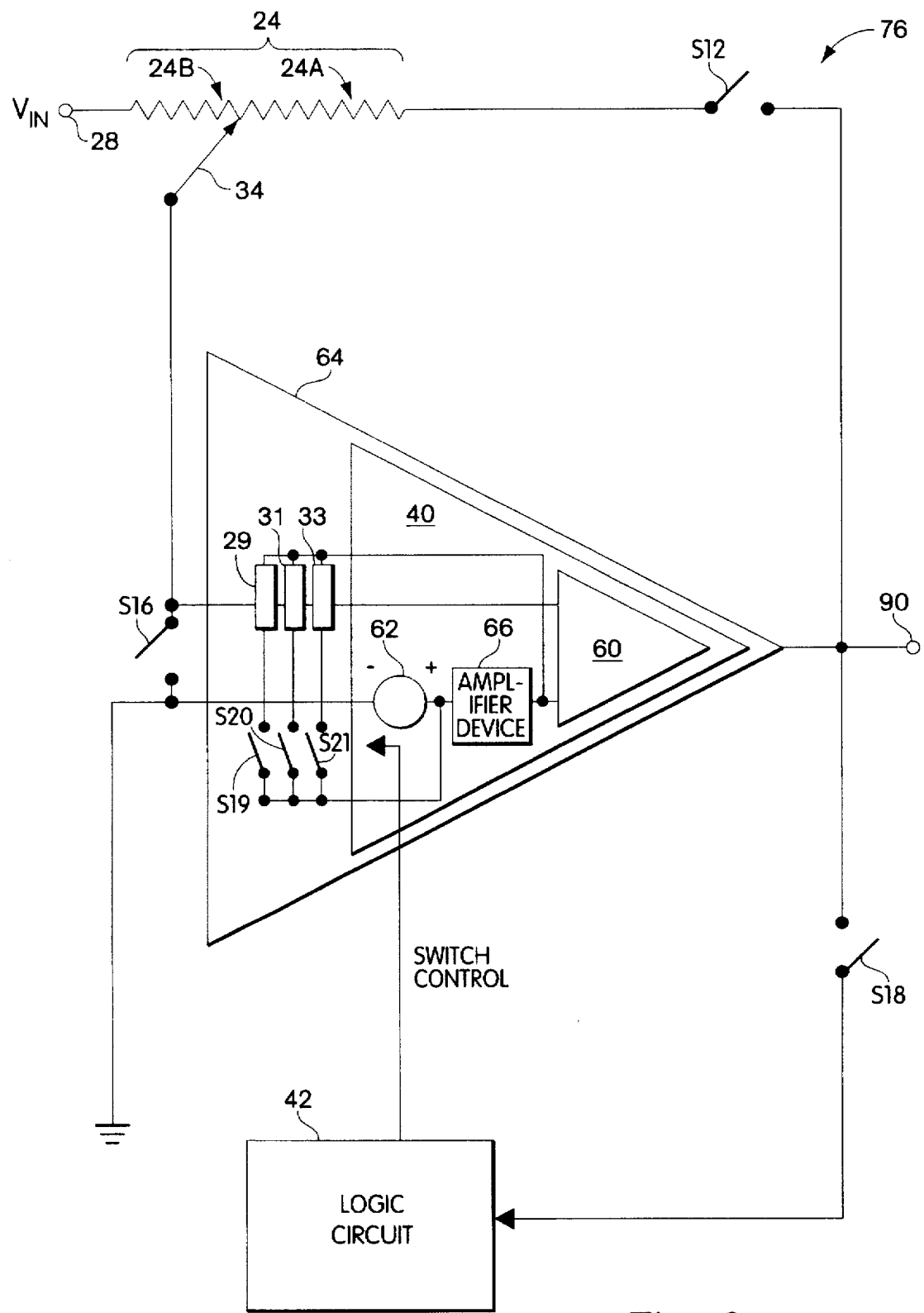
FIG. 2 is a partial schematic/partial block diagram of another offset calibration circuit which may be used with the invention.

FIG. 2 is a block diagram of a circuit 76 according to another aspect of the invention. As shown, circuit 76 is similar to circuit 36, except that the dc-offset voltage calibration of the amplifier in circuit 76 is accomplished by using several switches to alter the effective size of a primary device, e.g., a transistor, which is internal to amplifier 40. Primary amplifier device 66 in FIG. 2 could represent, for example, a transistor in a current mirror of the amplifier or one of a differential pair of input transistors. Secondary amplifier devices 29, 31 and 33 represent amplifier devices, e.g., transistors, which are substantially smaller than primary amplifier device 66. For example, if the primary and secondary devices are transistors, then the secondary transistor could have a channel length that is substantially (e.g., a factor of 100) shorter than the channel length of the primary transistor (or a channel width that is substantially (e.g., a factor of 100) wider than the channel width of the primary transistor).

In FIG. 2, (conceptual) amplifier 60 represents an ideal op-amp, i.e., an op-amp with no inherent dc-offset voltage. Amplifier 40 represents an actual amplifier and includes ideal amplifier 60, primary amplifier device 66 and voltage source 62 (representing the inherent dc-offset of amplifier 40). Op-amp 64, which includes secondary amplifier devices 31, 29 and 33 and switches S19, S20 and S21 (which are configured to switchably connect secondary devices 29, 31 and 33 in parallel with primary amplifier device 66) represents a dc-offset voltage compensating amplifier according to this aspect of the invention.

In a similar manner as with circuit 36, when switches S16 and S18 are open and switch S12 is closed, circuit 76 is configured as an amplifier or attenuator and an input signal $V_{IN}$ presented at node 28 will be amplified or attenuated (by a factor depending on the ratio of the resistances of resistor portions 24A and 24B of potentiometer 24, which ratio is determined by the position of wiper 34) and output at node 90. Conversely, when switches S16 and S18 are closed and switch S12 is open, amplifier 64 will be configured as a comparator and, as such, may be used to calibrate the inherent dc-offset voltage of amplifier 40 (which actually is a part of amplifier 64). Switch S16 is employed to electrically short together inputs 52 and 54 of amplifier 64 (when it is configured as a comparator during the calibration cycle). Again, the configuration of switches S12, S16 and S18 shown in circuit 76 is merely exemplary and any similar switching configuration that achieves a similar result alternatively may be employed.

A calibration cycle to calibrate amplifier 64 using circuit 76 may be initiated upon power up of a device including circuit 76 or may be initiated responsive to a user command. As mentioned previously, amplifier 64 is configured as a comparator during a particular time interval, i.e., the calibration cycle. Logic circuit 42 (which receives an output of the comparator) outputs a logic signal that controls several switches, e.g., switches S19, S20 and S21, which switches selectively connect corresponding secondary amplifier devices, e.g., secondary amplifier devices 29, 31 and 33, in parallel with a primary amplifier device, e.g., primary amplifier device 66.

At the end of a calibration cycle, when the intentionally created offset voltage introduced by the secondary amplifier devices should approximate the inherent dc-offset voltage (represented by voltage source 62) of amplifier 40, the final digital output of logic circuit 42 is held by logic circuit 42 and is used to permanently maintain the positions of the several switches, e.g., switches S19, S20 and S21, when amplifier 64 returns to normal operation (e.g., a gain or attenuation configuration). In this manner, switches S19, S20 and S21 (by controlling which of secondary amplifier devices 29, 31 and 33 are connected in parallel with primary amplifier device 66) may be used to calibrate the inherent dc-offset voltage of amplifier 40 by optimizing the effective size, for example, of a current mirror transistor within amplifier 40, as is explained in more detail below.

Figure 3:
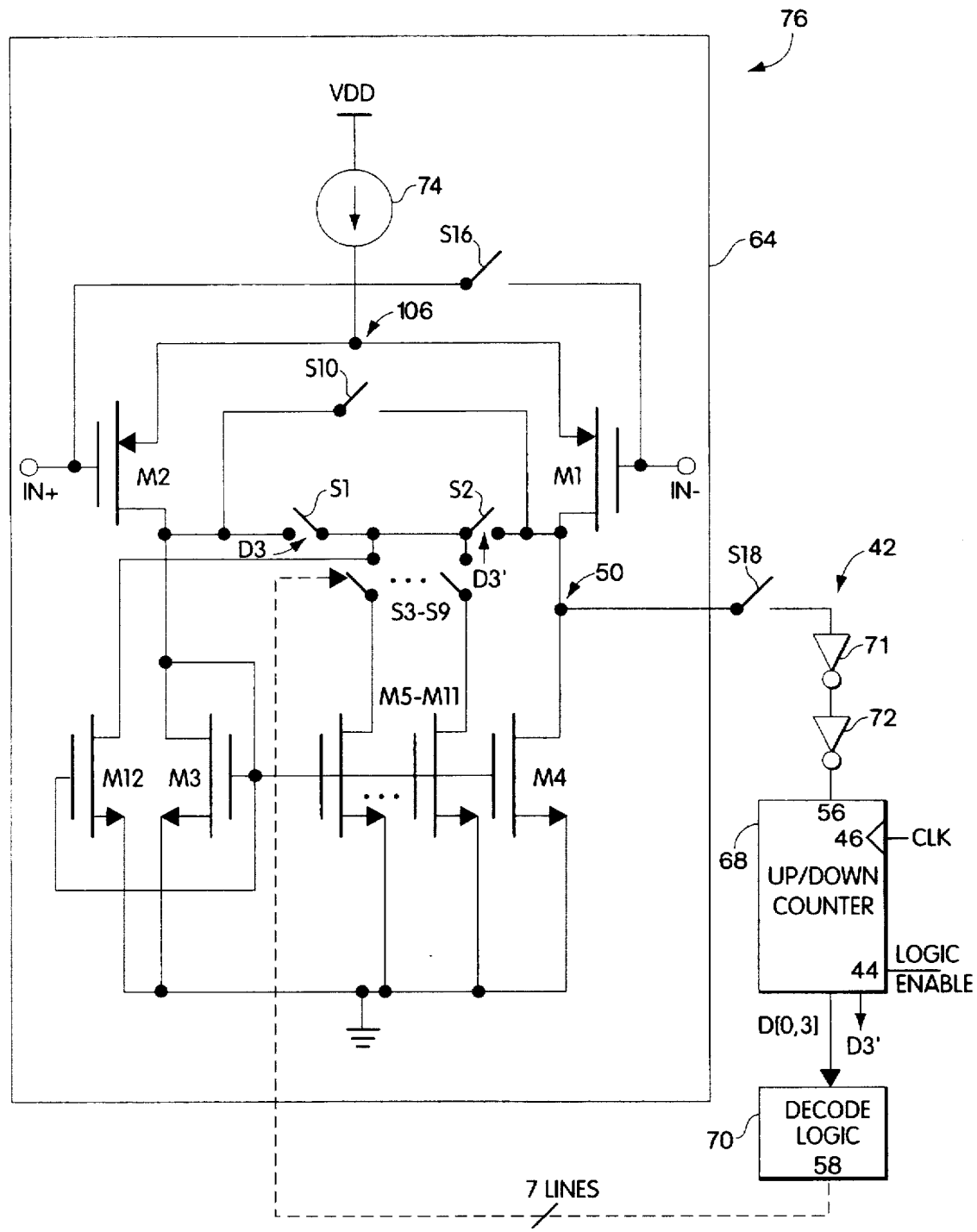
FIG. 3 is a more detailed partial schematic/partial block diagram of the offset calibration circuit shown in FIG. 2.

FIG. 3 is a more detailed diagram of an exemplary embodiment of circuit 76. As shown, a differential pair of (p-channel) input transistors M1 and M2 share a common source node 106. The common source node 106 is connected to and driven by current source 74, which also is connected to positive supply voltage node VDD. Complementary input nodes IN− and IN+ are connected to the gates (i.e., the control electrodes) of transistors M1 and M2, respectively. The output (i.e., the drain) of transistor M2 is connected to the drain of transistor M3, which drain is an input to a current mirror including (n-channel) transistors M3 and M4. The drain of transistor M3 is connected to the gate of transistor M3 as well as to the gate of transistor M4, and the sources of transistors M3 and M4 are connected to ground node GND. The output of the current mirror comprising transistors M3 and M4, i.e., the drain of transistor M4, is connected to the output, i.e., the drain, of input transistor M1 at output node 50.

Since amplifier 64 in circuit 76 is configured as a comparator during its calibration cycle, the voltage at output node 50 during this cycle will represent either logic high or logic low, depending on the value of the voltages applied to input nodes IN+ and IN−. Logic circuit 42 includes buffer inverters 71 and 72, up/down counter 68, and decode logic circuit 70. Output 50 is connected via switch S18 (which is closed during the calibration cycle) and buffer inverters 71 and 72 to the up/down selection input 56 of up/down counter 68. Up/down counter 68 also receives a signal LOGIC ENABLE 122 and a clock (CLK) signal at inputs 44 and 46, respectively. When the signal LOGIC ENABLE 122 at input 44 is asserted, e.g., during a calibration cycle, up/down counter 68, responsive to a rising edge of the clock signal at input 46, will count up or down, depending on the state of the up/down selection signal at input 56.

The four-bit (for example) output count (i.e., bits D0, D1, D2 and D3) of up/down counter 68 is passed to decode logic circuit 70, which circuit decodes the output count and outputs seven individual control lines at output 58. Each of these individual control lines carries a logic high or a logic low signal which is used to control one of seven switches S3-S9 (three of which could correspond with switches S19, S20 and S21 in FIG. 2) within amplifier 64, as is explained in more detail below. In addition, the most significant bit (D3) and the complement of the most significant bit (D3') of the output count are used to control switches S1 and S2, respectively, within amplifier 64.

Each of (n-channel) transistors M5-M11 in circuit 76 has a channel length that is similar to the channel length of transistor M4, but has a channel width that is substantially smaller than the channel width of transistor M4. In an exemplary embodiment, the channel width of transistor M4 is approximately one hundred times the channel width of each of transistors M5–M11. The sources and gates of each of transistors M5–M11 are connected, respectively, to ground node GND and to the gate of transistor M4. The drain node of each of transistors M5, M6, M7, M8, M9, M10, and M11 is connected to one pole of a corresponding one of switches S3, S4, S5, S6, S7, S8 and S9. By using switches S1–S9 to selectively connect or disconnect the drain nodes of transistors M5–M11 to or from either the output of transistor M1 or the output of transistor M2, the effective size of current mirror transistor M4 is increased or decreased. This trimming of the effective size of current mirror transistor M4 will, in turn, change the current flowing through the current mirror (comprised of transistors M3 and M4, as well as any of transistors M5–M41 that are switched in parallel with transistor M4) by discrete amounts. These discrete changes in current mirror output current will, in turn, alter the dc-offset voltage of the amplifier by discrete voltage values. Transistor M12 has its drain connected to the common node between switches S1–S9, its gate connected to the gate of transistor M4 and its source connected to ground node GND. Transistor M12 can have a channel length that is approximately twice the channel length of each of transistors M5–M11 and is used to add a slight offset to the amplifier when either switch S1 or S2 is activated, thus stabilizing the output signal at output 50.

As explained previously, up/down counter 68 and decode logic circuit 70 cooperate to control switches S1–S9 so as to increment or decrement the dc-offset correction voltage (created by transistors M5–M11) in conjunction with the counting up or counting down, respectively, of up/down counter 68. Without departing from the scope of the invention, switches analogous to switches S1–S9, by controlling corresponding devices which are appropriately connected, also could be used to alter the effective size of any device in the amplifier so as to compensate for the amplifier's inherent dc-offset voltage. For example, the effective size of the other current mirror transistor M3 could be trimmed using switches comparable to switches S1–S9.

During a calibration cycle, i.e., when amplifier 64 is configured as a comparator and the signal LOGIC ENABLE 122 at input 44 of up/down counter 68 is asserted, inputs IN+ and IN − are shorted together by closing shorting switch S116. Thus, any inherent dc-offset voltage of amplifier 40 will result in a corresponding logic state appearing at output 50 of amplifier 64. Up/down counter 68 will count either up or down, responsive to a clock signal at input 46, depending on the state of the signal at input 56. As the current in the current mirror (comprised of transistors M3 and M4, and any of transistors M5–M11 that are switched in parallel therewith) increases or decreases incrementally along with changes in the output count of up/down counter 68, at some point in the counting, the dc-offset voltage created by transistors M5–M11 will approximate the otherwise inherent dc-offset voltage of amplifier 40, and the signal at output 50 will change states. This change in state of the signal at output 50 will cause up/down counter 68 to count in the opposite direction, which, in turn, will cause the signal at output 50 to change states once again.

Thus, when the inherent dc-offset voltage (represented by voltage source 62) of amplifier 40 is approximated by the dc-offset voltage caused by transistors M5–M11, the signal at output 50 will change states every clock cycle, causing the counter to toggle its least significant bit until the end of the calibration cycle. At the end of the calibration cycle, the final digital count of up/down counter 68 is maintained by up/down counter 68 after the signal LOGIC ENABLE 122 is deserted. This maintained data then is used to engage or disengage each of switches S1–S9 permanently, as determined by the maintained data, after amplifier 64 is reconfigured in its normal operational mode (e.g., in a gain or attenuation configuration). For this calibration circuit to function properly, the maximum positive and negative offset compensation voltages which can be produced trimming transistor M5–M11 (based on the output of logic circuit 42) should be larger than the expected inherent dc-offset voltage of amplifier 40. Also, the calibration cycle should be long enough with respect to the clock (CLK) period such that a sufficient number of clock cycles occur during the calibration period to ensure that up/down counter 68 will, if necessary, reach its maximum or minimum count during a single calibration period. In addition, if possible, up/down counter 68 should be configured such that once its minimum or maximum count is reached, it maintains that count rather than wrapping to the maximum or minimum count, respectively.

At the end of a calibration cycle, switch S18 is opened and output 50 of amplifier 64 is reconnected to the circuit in which the amplifier is used. If output 50 has a logic high voltage present at the end of a calibration cycle, it might cause a voltage spike at an output of the circuit when it is reconnected to the circuit. Therefore, switch S10, which is connected between the outputs of the differential pair M1 and M2, is used to short output 50 to the output of transistor M2 just before the calibration cycle terminates. Because transistor M3 is diode-connected to ground node GND, the voltage at the output of transistor M2 remains relatively stable. Thus, shorting output 50 to the output of transistor M2 will reduce the voltage at output 50 to the voltage level at the output of transistor M2, thereby substantially reducing the amplitude of the voltage spike which might occur during the transition out of the calibration cycle.

Figure 4:
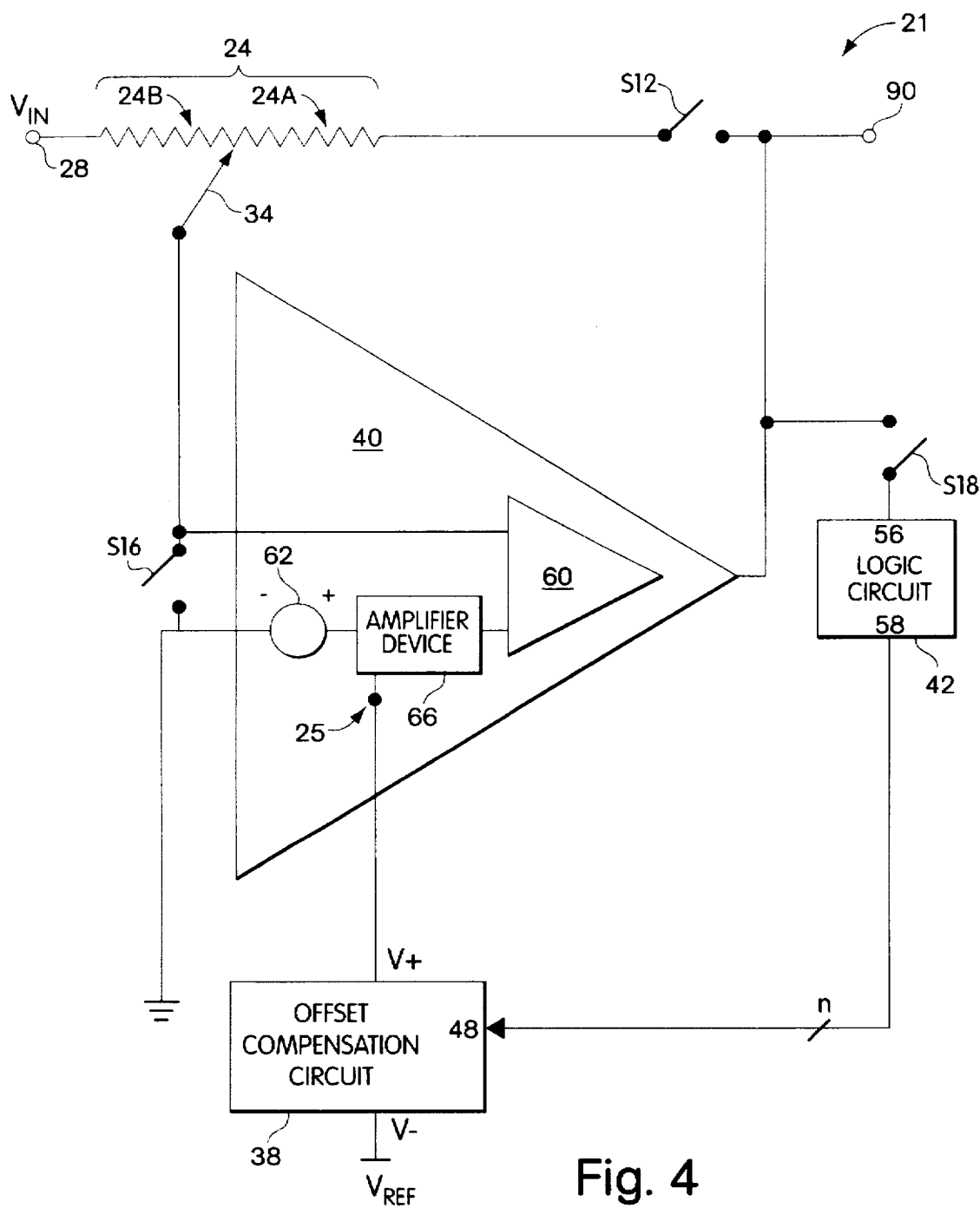
FIG. 4 is a partial schematic/partial block diagram of yet another offset calibration circuit which may be used with the invention.

FIG. 4 shows another circuit 21 according to yet another aspect of the invention. Circuit 21 is similar to circuit 76 (shown in FIG. 2) except for the manner in which an intentionally created offset voltage is created with amplifier device 66. Again, amplifier 40 is converted into a comparator (during a calibration cycle) by opening switch 12. Switches S16 and S18 also are closed during a calibration cycle. The closing of switch S16 (i.e., electrically shorting the inputs of amplifier 40) causes any inherent dc-offset voltage of amplifier 40 (e.g., the dc-offset voltage represented by voltage source 62) to force an output of amplifier 40 (operating as a comparator) to a particular state (e.g., logic high or logic low). Logic circuit 42 receives the logic high or logic low output of amplifier 40 at input 56 and, responsive to a clock signal, increases or decreases the value of a multi-bit output signal at output 58. Logic circuit 42 could be, for example, an up/down counter having its up/down select input connected to the output of amplifier 64.

The multi-bit output of logic circuit 42 is provided to input 48 of offset compensation circuit 38. Offset compensation circuit 38 could be, for example, a simple DAC that has a input 48 to receive the multi-bit output signal from output 58 of logic circuit 42 as well as positive and negative voltage outputs V+ and V−, respectively, across which an analog conversion of the digital input signal is provided. Negative voltage output V− is connected to a reference node having a particular voltage thereon. Positive voltage output V+ is connected to operating characteristic input lead 25 of amplifier device 23. Amplifier device 23 could represent, for example, a transistor in a current mirror of amplifier 40 and operating parameter control lead 25 could represent a lead which is connected to the substrate of the transistor. The output of offset compensation circuit 48, then, would bias the substrate of a transistor in amplifier 40. Such a biasing of the substrate of a transistor in amplifier 40 would cause a distinct alteration of the dc-offset voltage of amplifier 40.

Therefore, if logic circuit 42 is an up/down counter, offset compensation circuit 38 is a DAC and amplifier device 23 is a transistor in a current mirror of amplifier 40, then the counting up or down of logic circuit 42 would cause a stepwise increase or decrease in the dc-offset voltage introduced by the biasing of the substrate of the transistor. The calibration sequence used to calibrate the dc-offset of amplifier 40 in circuit 21 is similar to that used to calibrate the amplifiers in the circuits shown in FIGS. 1, 2 and 3. That is, logic circuit 42, e.g., an up/down counter, would count up or down in response to the logic level at its up/down select input until the inherent dc-offset voltage of amplifier 40 is approximated by the offset voltage intentionally introduced by the biasing of an operating characteristic of amplifier device 23. After a calibration cycle, then, the final output of logic circuit 42 may be held so as to maintain the voltage across outputs V+ and V− of offset compensation circuit 48, thereby permanently compensating for the dc-offset voltage of amplifier 40. Switches S16 and S18 may thereafter be opened and switch 12 may be closed so as to reconfigure amplifier circuit 21 in a gain or attenuation configuration.

When an op amp is configured as a comparator during a calibration cycle, the output of the op-amp must be switched out of the circuit in which it is used to avoid having the comparator's output signal, i.e., a high/low switching signal, influence the output of the circuit. Such a switching signal would be highly undesirable, for example, in an audio reproduction application as it would cause noise to emanate through an output device (such as a speaker). Instead, it is desirable generally to switch the amplifier/comparator out of the circuit and to maintain a constant signal level at the output of the circuit throughout the duration of the calibration sequence. The output signal level of the circuit should remain constant: (1) during the time period that the amplifier/comparator is switched out of the circuit, (2) during the time period the amplifier/comparator is being used as a comparator to calibrate the dc-offset, and (3) during the time period that the amplifier/comparator is switched back into the circuit.

Figure 5:
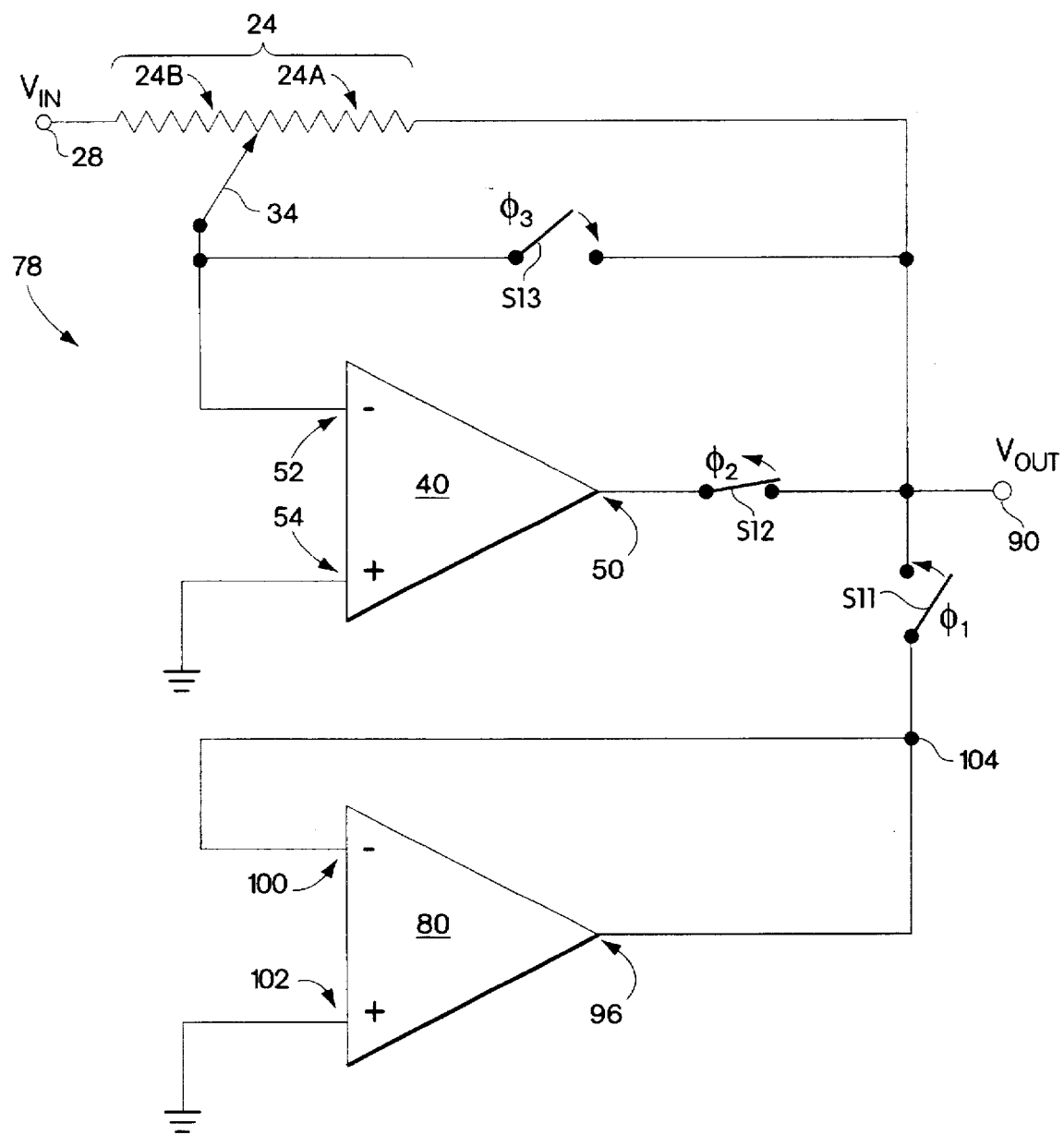
FIG. 5 is a partial schematic/partial block diagram of an amplifier circuit including a main amplifier and a catching amplifier according to the invention.

FIG. 5 is a circuit 78 that is designed to reduce voltage glitches at an output of a circuit when an output of an amplifier is switched out of and back into the circuit in order to undergo, for example, offset calibration. As shown, main amplifier 40 in circuit 78, which also could represent amplifier 40 in circuit 36 (shown in FIG. 1), amplifier 40 (as a part of amplifier 64) in circuit 76 (shown in FIGS. 2 and 3), or amplifier 40 in circuit 21 (shown in FIG. 4), receives an input signal at inverting input 52 (through resistor portion 24B of potentiometer 24) from input node 28. Potentiometer 24 (comprising resistor portions 24A and 24B) is connected between input node 28 and output node 90 of amplifier circuit 78 so as to allow the gain or attenuation of amplifier circuit 78 to be altered by adjusting the position of wiper 34. Non-inverting input 54 of main amplifier 40 is connected to a constant voltage reference node, e.g., ground node GND. Catching amplifier 80 in circuit 78 should be (proportionately) substantially identical to (although it may be substantially smaller than) main amplifier 40, as voltage glitches are reduced most effectively when these two amplifiers match one another (at least proportionately). Catching amplifier 80 could be, for example, two hundred times smaller than main amplifier 40 in order to reduce the power consumption of the circuit when catching amplifier 80 is switched into the circuit in place of main amplifier 40, as explained below.

Circuit 78 includes three switches S11, S12 and S13, which are controlled by switch control signals represented by the symbols Φ1, Φ2 and Φ3, respectively, shown next to the switches. Switch S11 is connected between output 96 of catching amplifier 80 and output node 90 of circuit 78, and is used to connect catching amplifier 80 to output node 90 during a time interval when the signal Φ1 is asserted. Switch S12 is connected between output 50 of main amplifier 40 and output node 90 of circuit 78, and is used to disconnect output 50 from output node 90 during a time interval when the signal Φ2 is asserted. Switch S13 is connected between output node 90 and inverting input 52 of main amplifier 40, and is used to place main amplifier 40 in a muting configuration during a time interval when the signal Φ3 is asserted and the signal Φ2 is deserted. That is, when switches S12 and S13 are closed, amplifier 40 has its inverting input connected to its output and, thus, is in a unity-gain feedback configuration. In such a unity-gain configuration the voltage at output 50 will follow the voltage at non-inverting input 54. Since non-inverting input 54 is connected to a constant voltage reference node, e.g., ground node GND, when switches S12 and S13 are closed, the voltage at output 50 will remain permanently at a voltage near the reference voltage, e.g., ground potential, regardless of the voltage placed at input node 28. Therefore, circuit 78 has a gain of approximately zero between input node 28 and output node 90. As used herein, an amplifier circuit in a muting configuration means any amplifier circuit configured to have a gain of approximately zero between its input and its output.

Catching amplifier 80 has a conductor connected between its inverting input 100 and its output 96 to place it permanently in a unity-gain feedback configuration. Catching amplifier 80 also has its non-inverting input 102 connected to a constant voltage reference node, e.g., ground node GND. Thus, when switch S11 is closed and switch S12 is open, output 90 of circuit 78 will be driven by catching amplifier 80 and, as such, circuit 78 will be configured to have a gain of approximately zero between input node 28 and output node 90. Therefore, amplifier circuit 78 may be placed in a muting configuration either by closing switch S13 (when switch S12 is closed) or by closing switch S11 (when switch S12 is open).

Figure 6:
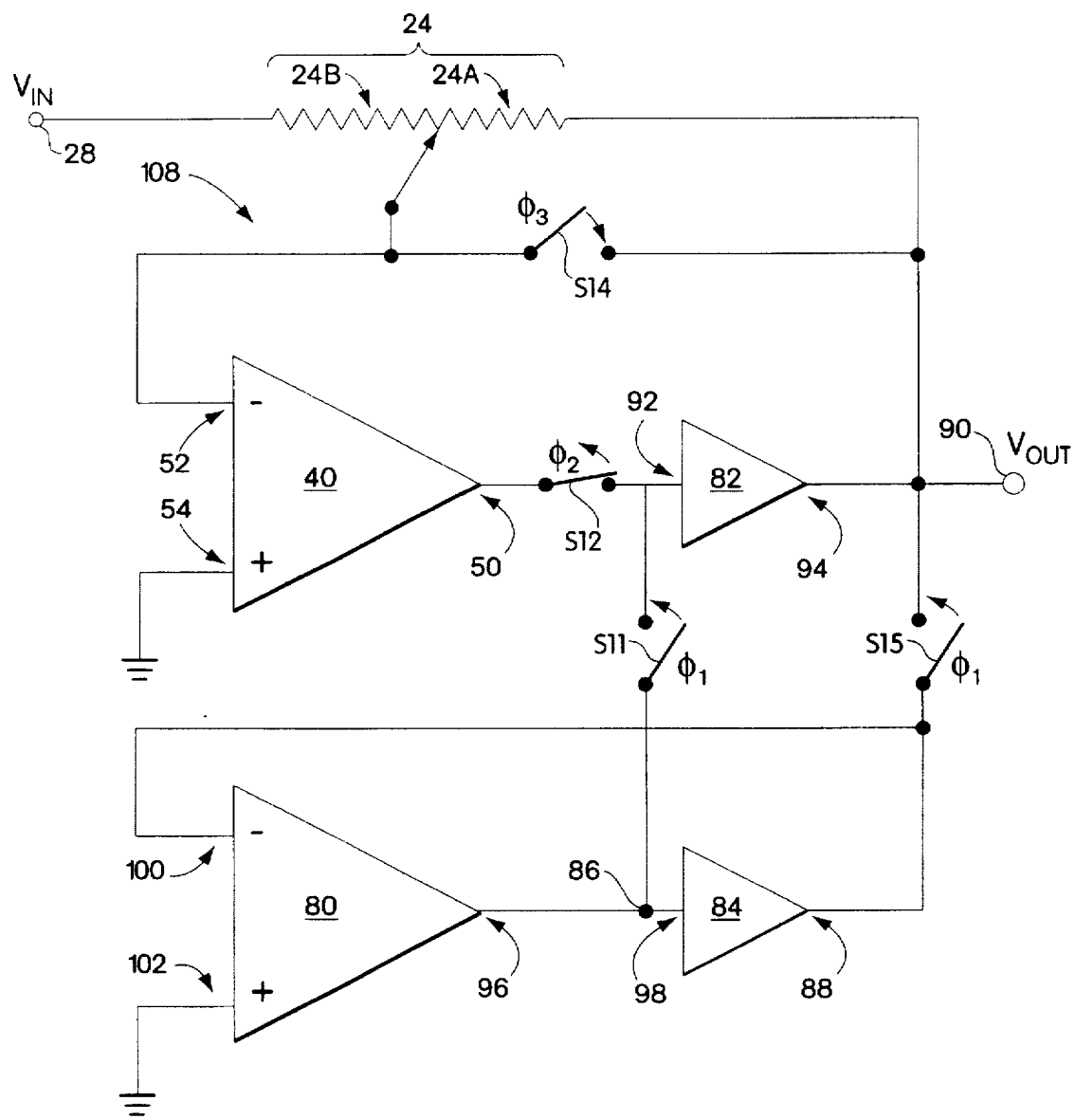
FIG. 6 is a partial schematic/partial block diagram of another amplifier circuit including a main amplifier and a catching amplifier according to the invention.
Figure 7:
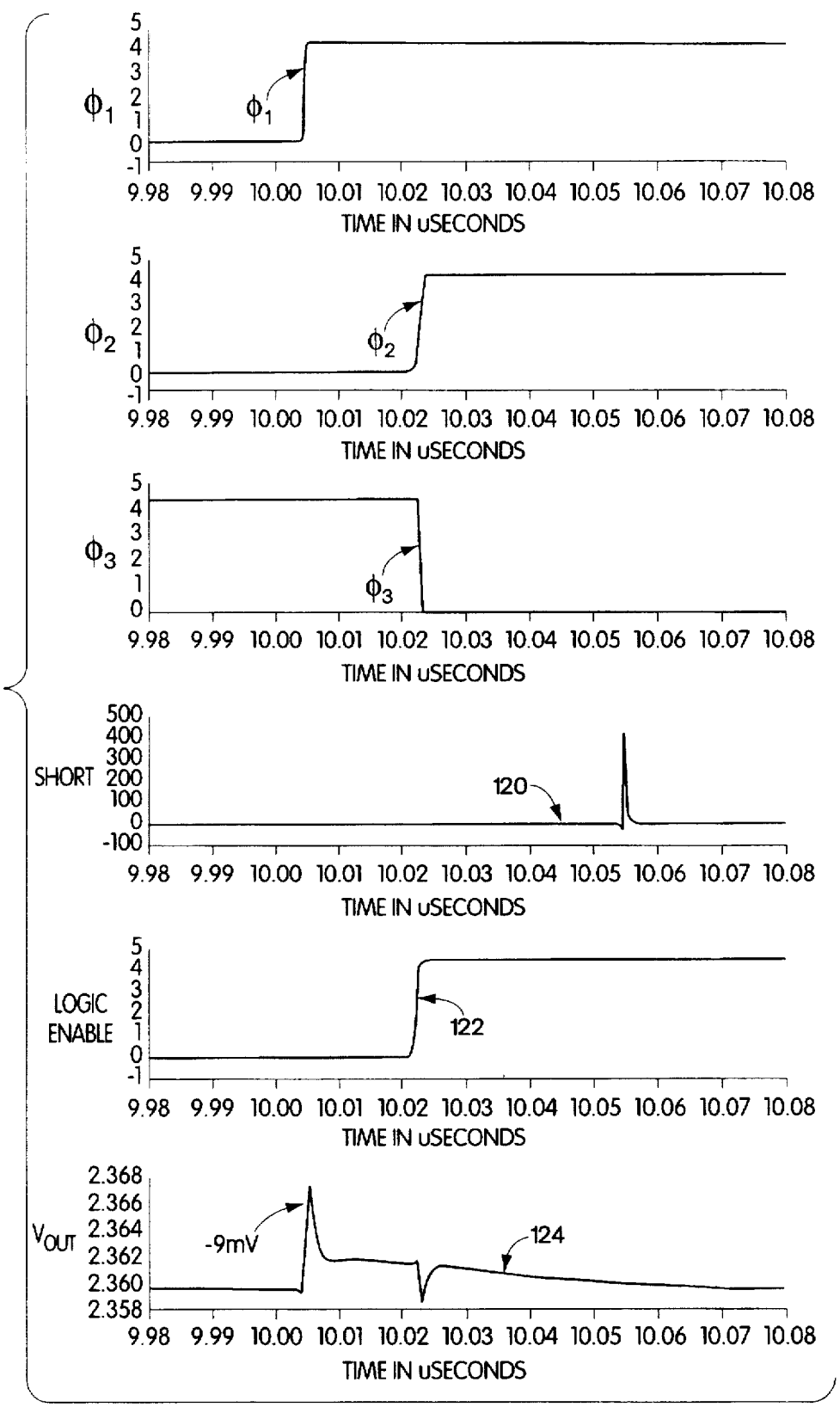
FIG. 7 is a timing diagram of several signals used in conjunction with the offset calibration circuits shown FIGS. 1–4 and the amplifier circuits shown in FIGS. 5 and 6 when those circuits enter an amplifier offset calibration cycle.
Figure 8:
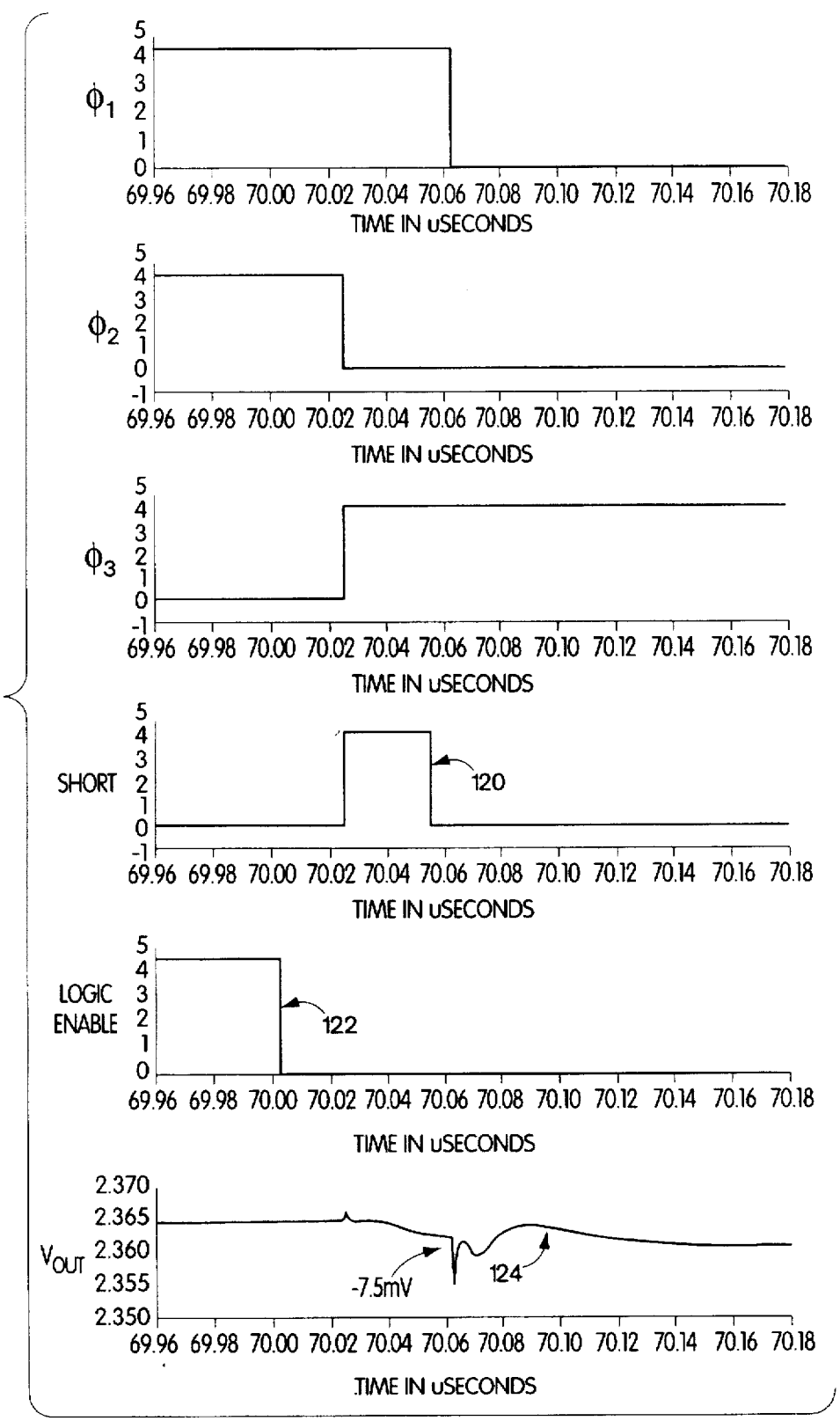
FIG. 8. is a timing diagram of several signals used in conjunction with the offset calibration circuits shown FIGS. 1–4 and the amplifier circuits shown in FIGS. 5 and 6 when those circuits exit an amplifier offset calibration cycle.

The signals Φ1, Φ2 and Φ3 are shown in the timing diagrams of FIGS. 7 and 8, along with several other signals. These signals are shown on the same time scale (horizontal axis) for comparison. The physical placement of one signal above another does not denote that one attains a higher magnitude than the other signals. The signal SHORT 120 in FIGS. 7 and 8 represents the signal controlling the operation of switch S10 in FIG. 3, the signal LOGIC ENABLE 122 represents the signal at input 44 of logic circuit 42 (shown in FIGs. 1, 2, 3 and 4), and the signal VOUT 124 represents the output voltage at the output node 90 of circuit 78 (or of circuit 108 (shown in FIG. 6)). Although the signal VOUT 124 (shown in FIGS. 7 and 8) is the output voltage resulting from a circuit simulation of circuit 108, a simulation of circuit 78 should yield a similar result. Each of switches S11, S13 and S10 is closed when its respective signal Φ1, Φ3 and SHORT 120 is asserted, while switch S12 is opened when the signal Φ2 is asserted.

The timing diagram of FIG. 7, in conjunction with FIG. 5, shows how circuit 78 enters its calibration cycle. All of the signals are deserted prior to entering a calibration cycle. First, the signal Φ3 is asserted so as to place amplifier circuit 78 in a muting configuration (by closing switch S13). Secondly, the rising edge of the signal Φ1 causes switch S11 to close, thereby connecting output 96 of catching amplifier 80 to output node 90. This closing of switch S11 causes a slight glitch in the output signal VOUT 124. After catching amplifier 80 is connected to output 90, the assertion of the signal Φ2 causes switch S12 to open, thereby disconnecting output 50 from output node 90 and from the catching amplifier. Since switch S11 is now closed, however, amplifier circuit 78 is maintained in a muting configuration. A slight glitch may appear in the output signal VOUT 124 when output 50 is disconnected from the circuit, as shown. At approximately the same time that the signal Φ2 is asserted, the signal Φ3 is deserted (causing switch S13 to open), thereby removing the unity-gain feedback loop from main amplifier 40 and causing amplifier 40 to run open-loop. Thus, with switches S12 and S13 both being open, main amplifier 40 is configured as a comparator and may be used as such to calibrate the dc-offset voltage of main amplifier 40, as explained above in connection with the descriptions of circuits 36 (shown in FIG. 1), 76 (shown in FIGS. 2 and 3) and 21 (shown in FIG. 4). Meanwhile, the signal LOGIC ENABLE 122 is asserted so as to enable the up/down counter and/or associated logic to determine a proper (digitally represented) offset calibration level for the circuit.

Referring now to FIG. 8, in conjunction with FIG. 5, the previously discussed signals are depicted as they appear when circuit 78 exits its calibration cycle. First, the signal LOGIC ENABLE 122 is deserted to disable the logic circuit and to permanently register the output of the up/down counter and/or related circuitry after calibration. Next, the signal Φ2 is deserted and the signal Φ3 is asserted causing switches S12 and S13, respectively, to close. Thus, output 50 of main amplifier 40 is reconnected to circuit node 90 and main amplifier 40 is connected back into a unity gain configuration, i.e., a configuration having a gain of one between non-inverting input 54 and output 50 of main amplifier 40. A slight glitch appears in the signal VOUTF 124 due to this reconnection. Meanwhile, after the signal LOGIC ENABLE 122 is deserted, but before the signal Φ1 is deserted, the signal SHORT 120 is asserted, causing the outputs of differential input transistors M1 and M2 (shown in FIG. 3) of main amplifier 40 to be shorted together. Next, just before the signal Φ1 is deserted (causing the catching amplifier to be disconnected from output node 90) the signal SHORT 120 is deserted (reopening switch S10). The signal Φ1 then is deserted, causing switch S11 to open and disconnecting catching amplifier 80 from output node 90. Since switch S13 is closed, however, amplifier circuit 78 remains in a muting configuration. Once again, a slight glitch occurs in the signal VOUT 124 due to the disconnection of catching amplifier 80. Now, after main amplifier 40 has its dc-offset voltage calibrated, the signal Φ3 may be deasserted and amplifier circuit 78 may resume normal operation as, for example, a gain or attenuation circuit.

FIG. 6 is another circuit 108 according to the invention. Circuit 108 is similar to circuit 78 except for the presence of main amplifier output stage 82 and catching amplifier output stage 84, and the configuration of the switches to service both stages of the amplifiers. Catching amplifier output stage 84 should be substantially identical to (i.e., sized proportionately to) main amplifier output stage 82, but can be, for example, two hundred times smaller than mail amplifier output stage 82 to reduce the power consumption of the circuit. Potentiometer 24 (comprising resistor portions 24A and 24B) is connected between input node 28 and output node 90 of amplifier circuit 108 so as to allow the gain or attenuation of amplifier circuit 108 to be altered by adjusting the position of wiper 34. Switch S12 is connected between output 50 of main amplifier 40 and input 92 of main amplifier output stage 82. Switch S12 serves to disconnect output 50 from input 92 during a calibration cycle. Switch S14 is connected between input 52 of main amplifier 40 and output 94 of main amplifier output stage 82 to connect amplifier circuit 108 in a muting configuration when switch S14 is closed, i.e., to configure circuit 108 to have a gain of approximately zero between input node 28 and output node 90. Switch S11 in connected between input 98 of catching amplifier output stage 84 and input 92 of main amplifier output stage 82, and switch S15 is connected between output 88 of catching amplifier output stage 84 and output 94 of main amplifier output stage 82. Output 96 of catching amplifier 80 is connected to input 98 of catching amplifier output stage 84, a conductor is connected between inverting input 100 of catching amplifier 80 and output 88 of catching amplifier output stage 84, and non-inverting input 102 of catching amplifier 80 is connected to a constant voltage reference node, e.g., ground node GND. Since the two-stage catching amplifier is so configured, when switches S11 and S15 are closed and switch S12 is opened, amplifier circuit 108 will be held in a muting configuration by the two-stage catching amplifier. As in circuit 78, the symbols Φ1, Φ2 and Φ3 beside the switches in amplifier circuit 108 represent signals that control the operation of the switches. These signals are shown in FIGS. 7 and 8, along with the other signals discussed in conjunction with FIG. 5. The operation of circuit 108 is nearly identical to that of circuit 78. First, switch S14 is closed responsive to the assertion of the signal Φ3, placing amplifier circuit 108 in a muting configuration. Next, the assertion of the signal Φ1 causes switches S11 and S15 to close, thereby engaging the catching amplifier. The signal Φ2 then is asserted (opening switch S12), the signal Φ3 is deasserted (opening switch S14), and the signal LOGIC ENABLE 122 is asserted. In this manner, the catching amplifier holds amplifier circuit 108 in a muting configuration as the main amplifier 40 is disengaged from the circuit, converted into a comparator, and calibrated. After the calibration sequence is complete, the signal LOGIC ENABLE 122 is deasserted, causing the final count of the up/down counter to be maintained at the output thereof. Just after the signal LOGIC ENABLE 122 is deasserted, the signal SHORT 120 is asserted (closing switch S10 in FIG. 3). Next, the signal Φ2 is deasserted (closing switch S12) and the signal Φ3 is asserted (closing switch S14), deconfiguring the main amplifier from its comparator mode. Finally, the signal SHORT 120 is deasserted (opening switch S10 in FIG. 3) just before the signal Φ1 is deasserted (opening switches S11 and S15), disconnecting the catching amplifier from the main amplifier. The signal Φ3 may subsequently be deasserted, allowing the main amplifier comprising main amplifier 40 and main amplifier output stage 82 to operate in a gain or attenuation configuration.

It should be understood that while the embodiments of the present invention described herein employ up/down counters to produce an increasing or decreasing digital signal, any logic circuitry producing a similar result may be used without departing from the scope of the invention. Also, the dc-offset of an amplifier may be calibrated with a finer or coarser resolution by using a counter with a greater or lesser number of bits and/or employing additional or fewer switches and trimming transistors in the circuit. The size of the trimming transistors also may be adjusted to suit a particular application. In addition, while the amplifier stages shown and described each comprise a single stage, each stage could likewise comprise several stages, also without departing from the scope of the invention.

Having thus described at least one illustrative embodiment of the invention, various alterations, modifications and improvements will readily occur to those skilled in the art. Such alterations, modifications and improvements are intended to be within the spirit and scope of the invention Accordingly, the foregoing description is by way of example only and is not intended as limiting. The invention is limited only as defined in the following claims and the equivalents thereto.

What is claimed is:

1. An amplifier circuit, comprising:
   an input lead to receive an input signal;
   a main amplifier including:
      a first stage having a first input coupled to the input lead to receive the input signal, and a first output to provide a first stage output signal; and
      a second stage having a second input switchably coupled to the first output to receive the first stage output signal, and a second output to provide an output signal to an output lead of the amplifier circuit; and
   a catching amplifier coupled to the second stage during at least one time interval so as to cause a gain of approximately zero to result between the input lead and the output lead during the at least one time interval, the main amplifier being arranged such that the first output is uncoupled from the second input during at least a portion of the at least one time interval.

2. The amplifier circuit as claimed in claim 1, wherein the catching amplifier is switchably coupled to the main amplifier via at least one catching switch configured to selectively couple at least one circuit node of the catching amplifier to at least one of the second input and the second output of the main amplifier, and the second input is switchably coupled to the first output via an uncoupling switch configured to selectively uncouple the first output from the second input.

3. The amplifier circuit as claimed in claim 1, wherein the catching amplifier includes a non-inverting input and an inverting input, and an output of the catching amplifier is connected to the inverting input and the non-inverting input is connected to a constant voltage circuit node.

4. The amplifier circuit as claimed in claim 1, wherein the catching amplifier includes a first catching stage and a second catching stage, an output of the first catching stage being coupled to an input of the second catching stage.

5. The amplifier circuit as claimed in claim 4, wherein the amplifier comprises a differential pair of input transistors and further includes a shorting switch connected to couple together a pair of outputs of the differential pair during a portion of the at least one time interval.

6. The amplifier circuit as claimed in claim 1, wherein the first stage of the main amplifier includes a differential pair of input transistors having a pair of control electrodes coupled to a pair of complementary input nodes of the first input, and the amplifier circuit further comprises a shorting switch switchably coupled between a pair of outputs of the differential pair of input transistors to selectively electrically short the pair of outputs of the differential pair.

7. An amplifier circuit, comprising:
   an input lead to receive an input signal;
   a main amplifier including:
      a first stage having a first input coupled to the input lead to receive the input signal, and a first output to provide a first stage output signal, and
      a second stage having a second input switchably coupled to the first output to receive the first stage output signal, and a second output to provide an output signal to an output lead of the amplifier circuit; and
   a catching amplifier switchably coupled to the output lead of the amplifier circuit to selectively configure the amplifier circuit to have a gain of approximately zero between the input lead and the output lead.

8. The amplifier circuit as claimed in claim 7, wherein the main amplifier is arranged such that the first output is uncoupled from the second input during at least a portion of at least one time interval during which the catching amplifier is coupled to the output lead.

9. An amplifier circuit, comprising:
   an input lead to receive an input signal;
   a main amplifier including:
      a first stage having a first input coupled to the input lead to receive the input signal, and a first output to provide a first stage output signal, and
      a second stage having a second input switchably coupled to the first output to receive the first stage output signal, and a second output to provide an output signal to an output lead of the amplifier circuit;
   a catching amplifier switchably coupled to the main amplifier to selectively configure amplifier circuit to have a gain of approximately zero between the input lead and the output lead; and
   a muting mechanism coupled to the main amplifier to selectively configure the amplifier circuit to have a gain of approximately zero between the input lead and the output lead.

10. An amplifier circuit, comprising:
    an input lead to receive an input signal;
    a main amplifier including:
       a main input coupled to the input lead to receive the input signal, and
       a main output switchably coupled to an output lead of the amplifier circuit to selectively provide an output signal to the output lead; and
    a catching amplifier switchably coupled to the output lead of the amplifier circuit to selectively configure the amplifier circuit to have a gain of approximately zero between the input lead and the output lead.

11. The amplifier circuit as claimed in claim 10, wherein an output of the catching amplifier is switchably coupled to the output lead via a catching switch, and the main output is switchably coupled to the output lead via an uncoupling switch.

12. The amplifier circuit as claimed in claim 10, wherein the catching amplifier includes a non-inverting input and an inverting input, an output of the catching amplifier is connected to the inverting input, and the non-inverting input is connected to a constant voltage circuit node.

13. The amplifier circuit as claimed in claim 10, wherein the catching amplifier is substantially smaller than the main amplifier.

14. The amplifier circuit as claimed in claim 10, wherein the main amplifier includes a differential pair of input transistors having a pair of control electrodes coupled to a pair of complementary input nodes of the main input, and the amplifier circuit further comprises a shorting switch switchably coupled between a pair of outputs of the differential pair of input transistors to selectively electrically short the pair of outputs of the differential pair.

15. The amplifier circuit as claimed in claim 10, wherein the main amplifier is arranged such that the main output is uncoupled from the output lead during at least a portion of at least one time interval during which the catching amplifier is coupled to the output lead.

16. An amplifier circuit, comprising:

an input lead to receive an input signal;

a main amplifier including:
- a main input coupled to the input lead to receive the input signal, and
- a main output switchably coupled to an output lead of the amplifier circuit to selectively provide an output signal to the output lead;

a catching amplifier switchably coupled to the main amplifier to selectively configure the amplifier circuit to have a gain of approximately zero between the input lead and the output lead; and a muting mechanism coupled to the main amplifier to selectively configure the amplifier circuit to have a gain of approximately zero between the input lead and the output lead.

17. A method for uncoupling an inter-stage output of an amplifier stage of a main amplifier from an inter-stage circuit node to which the inter-stage output is coupled while maintaining a relatively constant output signal at an output node of an amplifier circuit including the main amplifier, comprising the steps of:

configuring the amplifier circuit to have a gain of approximately zero between an input of the amplifier circuit and the output node of the amplifier circuit;

coupling at least one circuit node of a catching amplifier to at least one of the inter-stage circuit node and the output node of the amplifier circuit, the catching amplifier being configured to provide a gain of approximately zero between the input of the amplifier circuit and the output node of the amplifier circuit; and uncoupling the inter-stage output of the amplifier stage of the main amplifier from the inter-stage circuit node.

18. The method of claim 17, wherein the step of coupling the at least one circuit node of the catching amplifier to at least one of the inter-stage circuit node and the output node of the circuit includes coupling an inter-stage output of an amplifier stage of the catching amplifier to the inter-stage circuit node.

19. The method of claim 18, further comprising the step of coupling an output of the catching amplifier to the output of the main amplifier after performing the step of configuring the amplifier circuit to have a gain of approximately zero between the input of the amplifier circuit and the output node of the amplifier circuit.

20. A method for coupling an inter-stage output of an amplifier stage of a main amplifier to an inter-stage circuit node while maintaining a relatively constant output signal at an output node of an amplifier circuit including the main amplifier, comprising the steps of:

configuring the amplifier circuit to have a gain of approximately zero between an input of the amplifier circuit and the output node of the amplifier circuit;

coupling the inter-stage output of the amplifier stage of the main amplifier to the inter-stage circuit node; and uncoupling a circuit node of a catching amplifier, which is configured to provide a gain of approximately zero between the input of the amplifier circuit and the output node of the amplifier circuit, from the inter-stage circuit node.

21. The method of claim 20, further comprising the step of electrically shorting a pair of outputs of a differential pair of input transistors of the amplifier stage, which step is performed prior to performing the step of uncoupling the circuit node of the catching amplifier from the inter-stage circuit node.

22. The method of claim 20, further comprising the step of uncoupling an output of the catching amplifier from the output of the main amplifier after performing the step of coupling the inter-stage output of the amplifier stage of the main amplifier to the inter-stage circuit node.

23. A method for uncoupling an output of a main amplifier from an output node of a circuit while maintaining a relatively constant signal at the output node of the circuit, comprising the steps of:

configuring the circuit to have a gain of approximately zero between an input of the circuit and the output node of the circuit;

coupling an output of a catching amplifier, which is configured to provide a gain of approximately zero between the input of the circuit and the output node of the circuit, to the output node of the circuit; and uncoupling the output of the main amplifier from the output node of the circuit.

24. A method for coupling an output of a main amplifier to an output node of a circuit while maintaining a relatively constant output signal at the output node of the circuit, comprising the steps of:

configuring the circuit to have a gain of approximately zero between an input of the circuit and the output node of the circuit;

coupling the output of the main amplifier to the output node of the circuit; and uncoupling an output of a catching amplifier, which is configured to provide a gain of approximately zero between the input of the circuit and the output node of the circuit, from the output node of the circuit.

25. The method of claim 24, further comprising the step of electrically shorting a pair of outputs of a differential pair of input transistors of the main amplifier, which step is performed prior to performing the step of uncoupling the circuit node of the catching amplifier from the output node of the circuit.

* * * * *